(12) United States Patent
Oyamada et al.

(10) Patent No.: US 10,790,259 B2
(45) Date of Patent: Sep. 29, 2020

(54) CU ALLOY BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Takashi Yamada, Saitama (JP); Daizo Oda, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 16/637,672

(22) PCT Filed: Aug. 7, 2018

(86) PCT No.: PCT/JP2018/029588
§ 371 (c)(1),
(2) Date: Feb. 7, 2020

(87) PCT Pub. No.: WO2019/031497
PCT Pub. Date: Feb. 14, 2019

(65) Prior Publication Data
US 2020/0168578 A1 May 28, 2020

(30) Foreign Application Priority Data
Aug. 9, 2017 (JP) .................. 2017-154770

(51) Int. Cl.
*H01L 21/00* (2006.01)
*H01L 23/00* (2006.01)
(Continued)

(52) U.S. Cl.
CPC ............. *H01L 24/45* (2013.01); *C22C 9/06* (2013.01); *H01B 1/026* (2013.01);
(Continued)

(58) Field of Classification Search
CPC .......... H01L 24/45; H01L 2224/45015; H01L 2224/45147; H01L 2924/01015;
(Continued)

(56) References Cited

U.S. PATENT DOCUMENTS

| 6,406,566 B1 | 6/2002 | Ishida et al. | |
| 2012/0118610 A1* | 5/2012 | Terashima | C22C 5/06 174/126.2 |

(Continued)

FOREIGN PATENT DOCUMENTS

| JP | 2001-020026 A | 1/2001 |
| JP | 2011-003745 A | 1/2011 |

(Continued)

OTHER PUBLICATIONS

Decision to Grant a Patent issued in corresponding Japanese Application No. 2019-535669, dated Sep. 10, 2019, with English translation.

(Continued)

*Primary Examiner* — Richard A Booth
(74) *Attorney, Agent, or Firm* — McDermott Will & Emery LLP

(57) ABSTRACT

The present invention provides a Cu alloy bonding wire for a semiconductor device, where the bonding wire can satisfy requirements of high-density LSI applications. In the Cu alloy bonding wire for a semiconductor device, the abundance ratio of a crystal orientation <110> having an angular difference of 15 degrees or less from a direction perpendicular to one plane including a wire center axis to crystal (Continued)

orientations on a wire surface is 25% or more and 70% or less in average area percentage.

8 Claims, 2 Drawing Sheets

(51) Int. Cl.
*C22C 9/06* (2006.01)
*H01B 1/02* (2006.01)
(52) U.S. Cl.
CPC ............. *H01L 2224/43848* (2013.01); *H01L 2224/45015* (2013.01); *H01L 2224/45147* (2013.01); *H01L 2224/85075* (2013.01); *H01L 2924/01015* (2013.01); *H01L 2924/01028* (2013.01); *H01L 2924/01031* (2013.01); *H01L 2924/01032* (2013.01); *H01L 2924/01046* (2013.01); *H01L 2924/01047* (2013.01); *H01L 2924/01049* (2013.01); *H01L 2924/01078* (2013.01); *H01L 2924/01079* (2013.01)
(58) Field of Classification Search
CPC . H01L 2924/01028; H01L 2924/01031; H01L 2924/01032; H01L 2924/01046; H01L 2924/01047; H01L 2924/01049; H01L 2924/01078; H01L 2924/01079; C22C 9/06; H01B 1/026
See application file for complete search history.

(56) References Cited

U.S. PATENT DOCUMENTS

2017/0117244 A1\* 4/2017 Yamada .................. H01L 24/45
2017/0154863 A1\* 6/2017 Sarangapani ........... B21C 1/003
2017/0194280 A1\* 7/2017 Oda ........................ B32B 15/00

FOREIGN PATENT DOCUMENTS

| JP | 2014-070252 A | 4/2014 |
| JP | 2017-045924 A | 3/2017 |
| JP | 6600121 B2 | 10/2019 |
| WO | 2015/053128 A1 | 4/2015 |
| WO | 2015/152166 A1 | 10/2015 |
| WO | 2017/026077 A1 | 2/2017 |

OTHER PUBLICATIONS

International Search Report issued in International Application No. PCT/JP2018/029588, dated Sep. 25, 2018, with English translation.

\* cited by examiner

US 10,790,259 B2

CU ALLOY BONDING WIRE FOR SEMICONDUCTOR DEVICE

CROSS REFERENCE

This application is the U.S., National Phase under 35 U.S.C. § 371 of International Application No, PCT/JP2018/029588, filed on Aug. 7, 2018, which claims the benefit of Japanese Application No. 2017-154770, filed on Aug. 9, 2017, the entire contents of each are hereby incorporated by reference.

TECHNICAL FIELD

The present invention relates to a Cu alloy bonding wire for a semiconductor device, where the Cu alloy bonding wire is used to connect electrodes on semiconductor elements with a circuit wiring board such as external leads.

BACKGROUND ART

Currently, as bonding wires for semiconductor device (hereinafter referred to as bonding wires) for use to bond electrodes on semiconductor elements with external leads, fine wires approximately 15 to 50 μm in wire diameter are mainly used. As a method for bonding the bonding wires, a thermosonic bonding process is used commonly, and a general-purpose bonding machine, a capillary jig, and the like are used, where the capillary jig is used for connection by passing the bonding wire therethrough. A bonding wire bonding process involves heat-melting a wire tip by arc heat input, forming a ball (FAB: Free Air Ball) by surface tension, pressure-bonding the ball portion (hereinafter referred to as ball bonding) to an electrode of a semiconductor element heated in a range of 150 to 300° C., then forming a loop, and pressure-bonding a wire portion to an electrode on the side of the external lead (hereinafter referred to as wedge bonding) to complete the process.

As a bonding wire material, gold (Au) has mainly been used heretofore, but copper (Cu) has come to be used recently. Bonding wires made of Cu are high in electric conductivity and low in cost, and thus adopted in various semiconductor packages. Bonding wires made of Cu are roughly divided into bonding wires having a coating layer of Pd, Au, or another element on the surface of Cu (hereinafter referred to as coated Cu wires) and bonding wires not having a coating layer (hereinafter referred to as bare Cu wires). The coated Cu wires, which inhibit oxidation of copper on wire surfaces, which is a problem with bare Cu wires, have many advantages in terms of use performance. Therefore, the coated Cu wires are often adopted in high-density LSI applications that involve small wire diameter and have stringent performance requirements, in particular. On the other hand, the bare Cu wires, which are less costly than the coated Cu wires are mainly adopted in power device applications that involve large wire diameter and have relatively low performance requirements by taking advantage of their cost benefits.

In recent years, there has been growing demand for cost reduction of bonding wires, and the use of bare Cu wires for cutting-edge high-density LSIs has been under consideration. This is because the cutting-edge high-density LSIs, in which a large number of bonding wires are mounted, can enjoy the advantage of cost reduction by replacing coated Cu wires with inexpensive bare Cu wires. Along with enhancement in the accuracy and functionality of bonding machines, performance including ball formability and loop straightness relevant to performance requirements of high-density LSIs, is being improved and applicability of bare Cu wires is expanding. However, in order to apply bare Cu wires to high-density LSIs, there is still a problem to be overcome, i.e., a problem in a wedge bonding step, in particular.

Patent Literature 1 discloses a technique for forming an ultrathin copper layer not containing platinum on a wire by monotectoid reaction and forming an oxide film of 2 to 6 nm by oxidization in an air atmosphere on a surface layer of the wire after a drawing process in the process of forming the wire by continuous casting from a molten copper-platinum alloy made up of high-purity copper (Cu) containing 0.1 to 2.0 mass % of platinum (Pt), and containing 1 to 10 mass ppm of sulfur (S), 10 to 150 mass ppm of oxygen (O), and 1 to 5 mass ppm of phosphor (P) as nonmetallic elements.

Patent Literature 2 discloses a copper bonding wire containing 2 mass ppm or less of Cl and 2 mass % or more and 7.5 mass % or less of Au, and the balance being made up of Cu and incidental impurities. Thus, it is disclosed that the copper wire surface is very resistant to oxidation and that good wedge bondability can be obtained. In this way, a technique is disclosed that improves bonding strength of wedge bond areas of bare Cu wires by optimizing types and concentrations of additive elements or controlling the thickness of an oxide film.

CITATION LIST

Patent Literature

Patent Literature 1: Japanese Patent Laid-Open No. 2014-70252
Patent Literature 2: Japanese Patent Laid-Open No. 2011-3745

SUMMARY OF INVENTION

Technical Problem

As shown in FIG. 1A, a wedge bond area 104 formed by wedge-bonding a wire portion 100 to an electrode 102 usually has a fan-shaped deformed portion 105. In contrast, a deformed portion 107 containing peelings may be produced as in the case of a wedge bond area 106 shown in FIG. 1B. The peelings are defects caused in a wedge bonding step if part of a region of a bonding wire deformed into a fan shape and bonded to an electrode by the application of ultrasound and a load peels off when the bonding wire is pulled up. Occurrence of peelings had also been noted on Au wires and coated Cu wires, but by optimizing bonding conditions such as ultrasound and loads, the occurrence frequency of peelings was able to be reduced to a level that had no problem in practical use.

On the other hand, in the case of bare Cu wires, even if a technique disclosed in Patent Literature one or two is used, it is difficult to reduce the occurrence rate of peelings only by optimization of bonding conditions.

In the evaluation assuming high-density LSI applications, the inventors investigated the occurrence rate of peelings using typical bare Cu wires. As a result, it was found that bare Cu wires had a high occurrence rate of peelings and are not suitable for practical use. It was found that the occurrence rate of peelings increased with decreases in wire diameter and that the occurrence rate of peelings increased remarkably when the wire diameter was 20 μm or less, which was a dominating diameter of the bonding wires used for high-density LSI. It was found that the occurrence rate of peelings depended heavily on the material and structure of external electrodes to which the bonding wires were bonded. As electrodes on the side of external leads of metal lead frames used for high-density LSI applications, in addition to conventional Ag-plated electrodes (Ag electrodes), Pd-plated electrodes (Pd—PPF: Pd-Pre Plated Frame) are increasing in usage. The Pd-PPF generally has a structure in which Ni, Pd, and Au are laminated on an entire surface of the lead frame in this order starting from the side of the lead frame. It was found that the occurrence rate of peelings increased significantly when the bare Cu wires were bonded to the Pd-PPF than when the bare Cu wires were bonded to Ag electrodes.

Initially, the inventors presumed that the reason why the occurrence rate of peelings of bare Cu wires was high was that the bonding strength of wedge bond areas was low. Thus, the inventors tried to reduce the occurrence rate of peelings using the technique disclosed in Patent Literature 1 and Patent Literature 2, i.e., a technique for improving the bonding strength of wedge bond areas. The inventors investigated the occurrence rate of peelings by wedge-bonding the bare Cu wires to the Pd-PPF, and it was found that although the bonding strength of wedge bond areas was improved, the occurrence rate of peelings was not able to be reduced. That is, it was not possible to see a clear correlation between the bonding strength of wedge bond areas and the occurrence rate of peelings. Thus, it was found that to apply bare Cu wires to cutting-edge high-density LSIs, a new technique for reducing the occurrence rate of peelings was needed and that it was necessary to reduce the occurrence rate of peelings especially when the bare Cu wires were wedge-bonded to the Pd-PPF.

In cutting-edge high-density LSI applications, there is a growing need to reduce the bonding temperature of bonding wires (hereinafter referred to as low temperature bonding). A printed circuit board is used in a mounting structure such as a BGA (Ball Grid Array). Resins with low heat resistance are often used in printed circuit boards and the printed circuit boards are required to reduce bonding temperature compared to metal lead frames. When bonding to printed circuit boards is assumed, preferably temperature during bonding is reduced to 160° C. or less. A problem with such low temperature bonding is an increased occurrence rate of bonding defects (hereinafter referred to as non-stick failures) in which bonding wires separate completely from electrodes during a wedge bonding step.

Extended life of semiconductor devices demands longer service life of ball bond areas. As a method for evaluating the life of ball bond areas, a high temperature storage test, high temperature high humidity test, or thermal cycle test is conducted generally. Cutting-edge semiconductor devices are required to improve the life of ball bond areas to pass the high temperature storage test and need to satisfy operating performance of 500 hours or more at 200° C. When bare Cu wires were used, there was a problem in that separation occurred in the neighborhood of ball bond areas in a relatively short time during a high temperature storage test. When bare Cu wires were ball-bonded to pure Al electrodes and the ball bond areas were molded with a commercially available sealing resin and a high temperature storage test was conducted at 200° C., the bonding strength of the ball bond areas was reduced in 300 hours. When a section of a ball bond area in which reduction of bonding strength was noted was polished and a bonding interface of the ball bond area was observed under a scanning electron microscope (SEM), it was found that plural intermetallic compounds composed principally of Al and Cu were formed in the bonding interface of the ball bond area and that separation occurred in the neighborhood of the plural intermetallic compounds.

With cutting-edge high-density LSIs, downsizing and pitch reduction of electrodes on semiconductor elements are under way and the bonding wires require a technique for controlling ball deformation behavior during ball bonding. A problem posed by ball deformation is a defect in which balls are deformed into a petaline shape (hereinafter referred to as a deformation defect). Such a deformation defect in turn will cause defects such as reduced bonding strength due to insufficient transmission of ultrasound during a ball bonding step and short circuits due to contact between adjacent balls. Therefore, preferably crimping ball shape is close to a perfect circle when the ball is observed from above the electrode.

An object of the present invention is to provide a Cu alloy bonding wire for a semiconductor device, where the bonding wire can satisfy requirements of high-density LSI applications.

Solution to Problem

In a Cu alloy bonding wire for a semiconductor device according to the present invention, an abundance ratio of a crystal orientation <110> having an angular difference of 15 degrees or less from a direction perpendicular to one plane including a wire center axis to crystal orientations on a wire surface is 25% to 70% in average area percentage.

Advantageous Effects of Invention

The present invention can reduce the occurrence rate of peelings and thus can satisfy requirements of high-density LSI applications.

BRIEF DESCRIPTION OF DRAWINGS

FIG. 1A shows a good condition and FIG. 1B shows a condition in which peelings occur.

DESCRIPTION OF EMBODIMENTS

A bonding wire of the present embodiment is a Cu alloy bonding wire for a semiconductor device, wherein an abundance ratio of a crystal orientation <110> having an angular difference of 15 degrees or less from a direction perpendicular to one plane including a wire center axis to crystal orientations on a wire surface is 25% or more and 70% or less in average area percentage.

(Method for Determining Crystal Orientation on Wire Surface)

A method disclosed in the present specification, i.e., a method for measuring a crystal orientation on a bonding wire surface will be described. In the present specification, the crystal orientation on a wire surface is defined as the crystal orientation of an alloy part composed principally of Cu and Cu existing on the wire surface. The crystal orientation on the wire surface can be measured using an electron backscattered diffraction (EBSD) method provided in an SEM. The EBSD method involves directing an electron beam at a sample, projecting a diffraction pattern of reflected electrons thus generated at a detector surface, analyzing the diffraction pattern, and thereby determining the crystal orientations at individual measurement points. Dedicated software (OIM analysis and the like produced by TSL Solutions) is suitable for analyzing data obtained by the EBSD method. According to the present embodiment, a bonding wire is fixed to a sample stage, an electron beam is directed at the wire surface from one direction, and data on crystal orientations is obtained. Using this method, of the crystal orientations on the wire surface, a crystal orientation from the direction perpendicular to one plane including the wire center axis and a crystal orientation relative to the direction of the wire center axis can be determined. Using the crystal orientation data determined by the above method, the abundance ratio of a specific crystal orientation can be calculated.

As an example, description will be given of a method for calculating the abundance ratio of the crystal orientation <110> along the direction perpendicular to one plane including the wire center axis to the crystal orientations on the wire surface. The abundance ratio of the crystal orientation <110> is a ratio of the area occupied by the crystal orientation <110> determined by the above method to the area of a measurement region for EBSD.

Figure 1A:
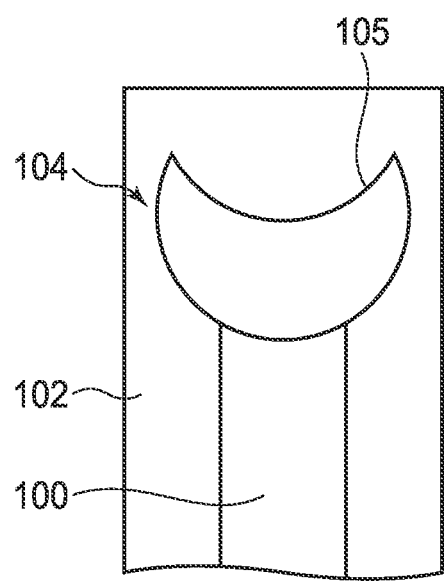
FIGS. 1A and 1B are schematic diagrams showing external appearance of wedge bond areas, where
Figure 1B:
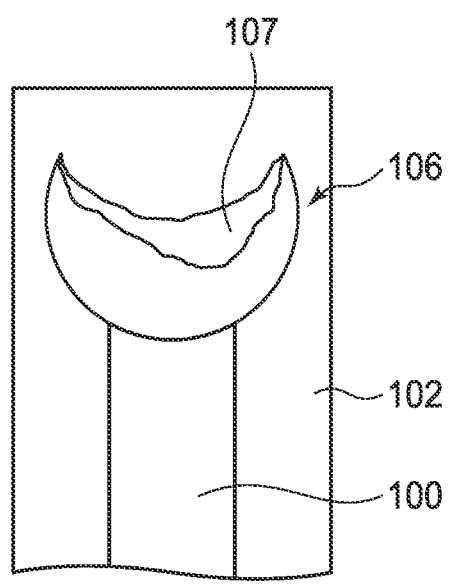
Figure 2:
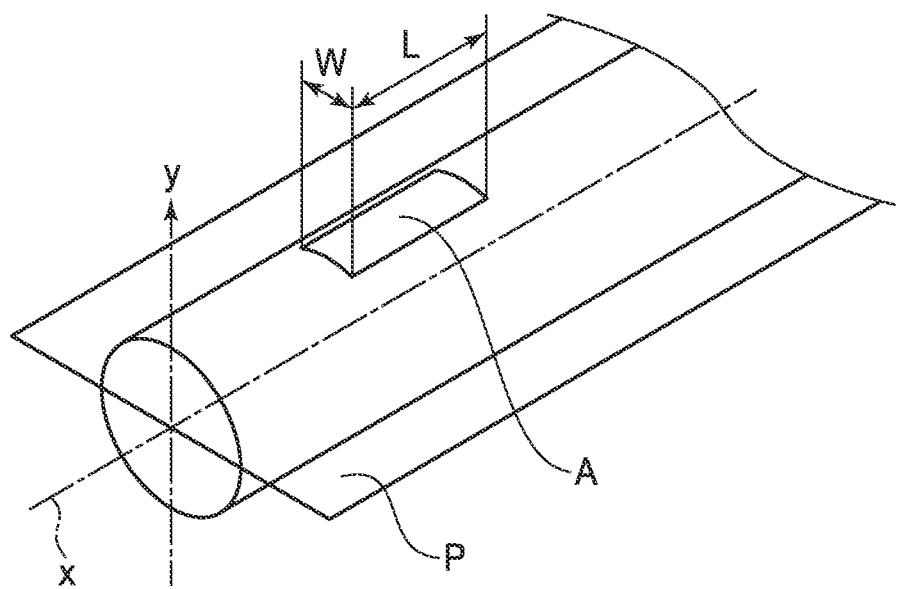
FIG. 2 is a perspective view explaining a measurement region.

As shown in FIG. 2, the crystal orientation <110> is defined herein as a crystal orientation having an angle of 15 degrees or less from a direction Y perpendicular to one plane P including a wire center axis X out of crystal orientations <110> on the wire surface. This is because effects advantageous for improvement of bonding wire characteristics can be obtained if the angle is 15 degrees or less. Abundance ratios of crystal orientations <111> and <100> with respect to the direction of the wire center axis X to the crystal orientations on the bonding wire surface can be calculated using a similar method.

Average area percentage is used herein as a value of the abundance ratio of a specific crystal orientation. The average area percentage is an arithmetic mean of values of abundance ratios obtained by measuring at least ten or more points by EBSD. In selecting the measurement points, preferably the objectivity of measurement data is ensured. As a method therefor, preferably measurement samples are taken from the bonding wire to be measured, at intervals of 3 to 5 m along the direction of the wire center axis X of the bonding wire and used for measurement. On an SEM image, preferably a measurement region A has a length W of 25% or less the wire diameter in a circumference direction and a length L of 40 μm to 100 μm in the direction of the wire center axis X.

It was confirmed that the crystal orientations and their area percentages measured by EBSD using the above method had a strong correlation with a reduction effect on the occurrence rate of peelings, where the reduction effect is a working effect of the present invention. The wire surface is a curved surface, and deviates from the orientation perpendicular to the wire surface with increasing distance in a circumferential direction from a peak (the highest point of the wire fixed to the sample stage from the circumferential direction) of the wire, but it can be said that the measurement data taken by the above method is consistent with the actual conditions indicating the reduction effect on the occurrence rate of peelings. This is because when the length W of the measurement region A is at least 25% or less the wire diameter, in the EBSD measurement region of the wire surface having a curved surface, the deviation of the orientation perpendicular to the wire surface from the circumferential direction is permissible and the reduction effect on the occurrence rate of peelings can be obtained. The reason why a lower limit is placed on the measurement region A in the direction of the wire center axis X is that it was judged that measurement data reflected characteristics of the sample sufficiently if the length L was 40 μm or more. The reason why an upper limit is placed on the measurement region A in the direction of the wire center axis X is that analysis can be conducted efficiently if the length L is 100 μm or less.

There may be a copper oxide film and/or impurities on the surface of the bonding wire. Examples of the impurities include organic matter, sulfur, nitrogen, and compounds thereof. Even if such impurities exist, if the thickness of impurities is small or the abundance thereof is low, by optimizing measurement conditions of the EBSD method, the crystal orientations on the bonding wire surface can be measured. If there is a thick copper oxide film or a large deposit of impurities on the bonding wire surface, it may be impossible to measure crystal orientations in Cu or in a Cu alloy part. In that case, it is useful to treat the bonding wire surface by alkaline degreasing, acid washing, ion sputtering, or the like before EBSD measurements are taken.

(Reduction Effect on Occurrence Rate of Peelings)

The inventors investigated governing factors of the occurrence rate of peelings, and noted a correlation with a crystal orientation on the bonding wire surface. That is, there is a correlation between the abundance ratio of the crystal orientation <110> having an angular difference of 15 degrees or less from the direction perpendicular to one plane including the wire center axis and the occurrence rate of peelings, and by keeping the abundance ratio of the crystal orientation <110> in an appropriate range, the effect of reducing the occurrence rate of peelings can be obtained. The reduction in the occurrence rate of peelings inhibits variation in the ball shape of balls formed subsequently.

In a Cu alloy bonding wire for a semiconductor device, according to that an abundance ratio of a crystal orientation <110> having an angular difference of 15 degrees or less from the direction perpendicular to one plane including a wire center axis to the crystal orientations on the wire surface is 25% or more and 70% or less in average area percentage, and preferably 30% or more and 70% or less, the occurrence rate of peelings is reduced. Specifically, as a result of that 100 wedge bond areas were formed on a Pd-PPF using the bonding wire of the present embodiment and the wedge bond areas were observed under an optical microscope, it was confirmed that the occurrence rate of peelings was reduced. As a result of that wedge bond areas were observed in detail under an SEM, and it was found that adhesion of parts deformed into a fan shape had been improved. In particular, adhesion of parts which served as starting points for peelings and in which the wires were deformed and thinned of the parts deformed into a fan shape were improved, offering a good state of bonding to the Pd-PPF. The adhesion of the parts in which the bonding wire is deformed and thinned are largely attributable to characteristics of the wire surface. As a reason why the bonding wire of the present embodiment exhibited the reduction effect on the occurrence rate of peelings, it is considered that the increase in the abundance ratio of the crystal orientation <110> having an angular difference of 15 degrees or less from the direction perpendicular to one plane including the wire center axis improved ductility of the wire surface, making it easy to transmit ultrasound to the wire and thereby improving adhesion to the electrode.

When the abundance ratio was less than 25% in average area percentage, the reduction effect on the occurrence rate of peelings was not seen. When the abundance ratio exceeded 70% in average area percentage, it was found that the bonding wire was not suitable for practical use because an occurrence rate of defects which are called eccentricity and in which a ball formation position deviates from the center of the wire increased in a ball formation step. A conceivable cause of this is that in forming balls by melting the tip of the bonding wire by arc discharge, the arc spreads, making the starting location of melting of the bonding wire unstable.

More preferably the abundance ratio of the crystal orientation <110> having an angular difference of 15 degrees or less from the direction perpendicular to one plane including the wire center axis is 40% or more and 70% or less in average area percentage, because the reduction effect on the occurrence rate of peelings is heightened.

(Improvement Effect on Low Temperature Bonding Performance)

Furthermore, in the bonding wire of the present embodiment, preferably the total of the abundance ratios of crystal orientations <111> and <100> having an angular difference of 15 degrees or less from the direction of the wire center axis to the crystal orientations on the wire surface is 50% or more and 98% or less in average area percentage, and more preferably 50% or more and 90% or less. Specifically, the occurrence rate of non-stick failures in low temperature wedge bonding was investigated using the bonding wire of the present embodiment and an excellent reduction effect was obtained. A conceivable reason for this is that the abundance ratio of the crystal orientation <110> having an angular difference of 15 degrees or less from the direction perpendicular to one plane including the wire center axis to the crystal orientations on the wire surface, if kept 25% or more and 70% or less in average area percentage, has the effect of reducing variation of strength on the wire surface and the increase in the abundance ratios of crystal orientations <111> and <100> having an angular difference of 15 degrees or less from the direction of the wire center axis has the effect of reducing variation of strength in the direction of the wire center axis, and these effects act synergistically to reduce variation in the shape of wedge bond areas. When the abundance ratio is less than 50% in average area percentage, the effect of reducing the occurrence rate of non-stick failures in low temperature wedge bonding is insufficient. When the abundance ratio exceeds 98% in average area percentage, yield strength of the bonding wire becomes too high, making the bonding area in a wedge bonding step insufficient, and thus the effect of reducing the occurrence rate of non-stick failures is insufficient. When the abundance ratio is 90% or less in average area percentage, it is possible to more reliably keep the yield strength of the bonding wire from becoming high.

(Improvement Effect on Ball Bond Area Life in High Temperature Storage Test)

Preferably the bonding wire of the present embodiment further contains one or more of Ni, Pd, Pt, and Au for a total of 0.01 mass % or more and 3.00 mass % or less. This can improve ball bond area life in 200° C. high temperature storage test. Conceivably this is because by controlling the abundance ratio of the crystal orientation <110> having an angular difference of 15 degrees or less from the direction perpendicular to one plane including the wire center axis, peelings were inhibited, consequently inhibiting subsequent variation in ball shape and thereby facilitating diffusion of the added Ni, Pd, Pt, and/or Au into ball bond areas, and the effect of reducing the growth rate of intermetallic compounds in which the elements described above caused reduction in bonding strength was enhanced synergistically. When the concentration of the elements is less than 0.01 mass %, the effect of reducing the growth rate of intermetallic compounds is insufficient. When the concentration of the elements exceeds 3.00 mass %, the hardness of balls increases, making formation of intermetallic compounds nonuniform, and thus the improvement effect on ball bond area life in 200° C. high temperature storage test is insufficient.

Out of the Ni, Pd, Pt, and Au described above, preferably Pt is contained because an excellent improvement effect on ball bond area life in 200° C. high temperature storage test is obtained.

(Improvement Effect on Crimping Ball Shape)

Preferably the bonding wire of the present embodiment further contains one or more of P, In, Ga, Ge, and Ag for a total of 0.001 mass % or more and 1.00 mass % or less. This can improve the crimping shapes of ball bond areas. It is presumed that the reason why this effect was available was that crystal grains making up the balls were refined, facilitating isotropic deformation. When the concentration is less than 0.001 mass %, the effect is insufficient. When the concentration exceeds 1.00 mass %, monotectoid becomes remarkable, causing variation in ball diameter during ball formation, and thus the effect is insufficient.

Preferably the concentrations of one or more of the P, In, Ga, Ge, and Ag described above are 0.001 mass % or more and 0.1 mass % or less in total, because the variation in ball diameter during ball formation is inhibited, resulting in an excellent crimping ball diameter. More preferably when Ag is contained, because the variation in ball diameter during ball formation is further inhibited, resulting in particularly excellent accuracy of the crimping ball diameter.

(Method for Producing Bonding Wire)

A production method of a bonding wire for a semiconductor device of the present embodiment will be described.

(Melting Method)

First, using high-purity Cu with copper purity of 4N to 6N (Cu concentration: 99.99 mass % or more and 99.9999 mass % or less), a copper alloy containing necessary concentrations of additive elements is prepared by melting. An arc melting furnace, high-frequency melting furnace, or the like can be used for the melting. To prevent admixture of atmospheric gases such as $O_2$ and $H_2$, preferably the melting is done in a vacuum atmosphere or in an inert atmosphere of Ar, $N_2$, or another gas. After the melting, the copper is cooled slowly in the furnace to prepare an ingot. Preferably, surfaces of the ingot produced by melting are washed with acid or alcohol, followed by subsequent drying.

(Description of Drawing Process and Heat Treatment)

Preferably the copper alloy ingot thus produced is processed first into a thick diameter by rolling and forging and then reduced in diameter by a drawing process until a final wire diameter is reached. A continuous wire drawing machine capable of being equipped with plural diamond-coated dies can be used for the drawing process. Preferably a lubricant is used during continuous wire drawing to reduce worn-out of the dies and wire surface flaws. At an intermediate wire diameter in a preceding stage before a final wire diameter is reached, preferably intermediate heat treatment is carried out at an intermediate stage of the drawing process for the principal purpose of removing strain. With the final wire diameter, final heat treatment is carried out to adjust breaking elongation by recrystallizing the bonding wire. It is useful to carry out the intermediate heat treatment and final heat treatment while continuously running the wire. Note that preferably the heat treatment is carried out by refluxing Ar gas or $N_2$ gas to inhibit oxidation of the bonding wire surface during the heat treatment as much as possible. It is also useful that small percentages of $H_2$ is contained.

(Method for Controlling Crystal Orientation on Wire Surface)

To control the crystal orientations on the wire surface, it is useful to control conditions for a wire drawing process or conditions for final heat treatment. A representative control method is shown below. Description will be given below of an example in which, the abundance ratio of the crystal orientation <110> having an angular difference of 15 degrees or less from the direction perpendicular to one plane including the wire center axis to the crystal orientations on the wire surface is kept 25% or more and 70% or less in average area percentage. When a drawing process is performed, the abundance ratio of the crystal orientation <110> from the direction perpendicular to one plane including the wire center axis to the crystal orientations on the wire surface tends to increase. On the other hand, when heat treatment is carried out after the drawing process, random orientations develop due to recrystallization, and consequently the crystal orientation <110> tends to decrease. To control the crystal orientations on the wire surface, it is useful to control the abundance ratio of the crystal orientation <110> by recrystallizing the bonding wire by final heat treatment after the crystal orientation <110> is developed by the drawing process.

First, proper conditions for the drawing process will be described. In the drawing process, to increase the abundance ratio of the crystal orientation <110> having an angular difference of 15 degrees or less from the direction perpendicular to one plane including the wire center axis, it is useful to increase a processing rate of the drawing process. The processing rate in the drawing process is defined by the following expression.

$$P=\{(R_1^2-R_2^2)/R_1^2\}\times 100$$

P: Processing rate of drawing process
$R_1$: Wire diameter (mm) before drawing process
$R_2$: Wire diameter (mm) after drawing process To produce the bonding wire of the present embodiment, it is useful to keep the processing rate of the drawing process 85% or more and less than 100%. This is because if the processing rate of the drawing process is 85% or more, the abundance ratio of the crystal orientation <110> immediately after the drawing process can be increased to at least 72% or more, and if final heat treatment is carried out subsequently in a proper temperature range, the abundance ratio of the <110> can be kept at 25% or more. If intermediate heat treatment is carried out before a final wire diameter is reached, the wire diameter after the intermediate heat treatment can be used as the wire diameter ($R_1$) before the drawing process.

Next, proper conditions for the final heat treatment will be described. There are three major final heat treatment conditions that affect the abundance ratio of the <110>: heat treatment temperature, heat treatment time, and cooling rate.

It is useful to set the final heat treatment temperature and final heat treatment time at 300° C. or more and 620° C. or less and 0.02 seconds or more and 1.3 seconds or less respectively. As long as the heat treatment temperature and heat treatment time are in the above ranges, the abundance ratio of the crystal orientation <110> increased by the drawing process can be kept 25% or more and 70% or less by the final heat treatment. The reason why the lower limit of the final heat treatment temperature is 300° C. and the lower limit of the final heat treatment time is 0.02 seconds is that recrystallization is less likely to occur under conditions lower than these lower limits, making it difficult for crystal orientations other than the crystal orientation <110> to develop and thereby causing the abundance ratio of the crystal orientation <110> to exceed 70%. The reason why the upper limit of the final heat treatment temperature is 620° C. and the upper limit of the final heat treatment time is 1.3 seconds is that under conditions exceeding these upper limits, the crystal orientations other than the crystal orientation <110> develop, thereby causing the abundance ratio of the crystal orientation <110> to become less than 25%.

Preferably a wire cooling rate after the final heat treatment is in a range of 130° C./sec to 1200° C./sec. When the cooling rate is less than 130° C./sec, recrystallization progresses in a cooling step, causing the abundance ratio of the crystal orientation <110> to become less than 25%. When the cooling rate exceeds 1200° C./sec, it becomes necessary to use water cooling or to blow gas, which is not suitable for practical use in actual facilities because of increased cost and oxidation of the wire itself. As a method for controlling the cooling rate, it is useful to provide a final heat treatment site and a cooling site separately. For example, if a structure for continuously running the wire is assumed, after the final heat treatment is applied to the wire, the cooling rate can be controlled by circulating inert gas and passing the wire through a properly temperature-controlled site.

(Method for Controlling Crystal Orientations with Respect to Direction of Wire Center Axis on Wire Surface)

Next, description will be given below of a method for keeping the total of the abundance ratios of crystal orientations <111> and <100> having an angular difference of 15 degrees or less from the direction of the wire center axis to the crystal orientations on the wire surface 50% or more and 98% or less in average area percentage. To control the crystal orientations <111> and <100>, it is useful to control a wire feed rate during the drawing process and a processing rate per die used for the drawing process. By varying the wire feed rate, it is possible to control a frictional force generated on an interface between the die and wire and relevant to development of the crystal orientation in the direction of the wire center axis on the wire surface. To control the crystal orientations <111> and <100>, it is useful to keep the wire feed rate 800 m/min or more and 1100 m/min or less and the processing rate per die 14% or more and 24% or less. If the above conditions are satisfied, the total of the abundance ratios of crystal orientations <111> and <100> can be kept 50% or more and 98% or less in average area percentage. The reason why the lower limit of the wire feed rate is less than 800 m/min and the lower limit of the processing rate per die is less than 14% is that otherwise the total of the abundance ratios of crystal orientations <111> and <100> will become less than 50% in average area percentage. The reason why the upper limit of the wire feed rate is 1100 m/min and the upper limit of the processing rate per die is 24% is that under conditions exceeding these upper limits, the total of the abundance ratios of crystal orientations <111> and <100> will exceed 98% in average area percentage.

(Alloying Method)

Available methods for alloying copper with alloying elements include a method of directly melting and alloying copper and high-purity additive elements and a method of preparing a master alloy made up of copper and approximately 3 to 5 mass % additive elements in advance and melting and alloying copper with the master alloy. The method that uses a master alloy is effective in making an element distribution uniform at a low concentration.

An ICP optical emission spectrometer or the like can be used for concentration analysis of elements contained in the bonding wire. If elements such as oxygen, carbon, and/or sulfur are adsorbed to the surface of the bonding wire, before conducting analysis, concentration measurements may be taken after shaving a region of 1 to 2 nm off the surface of the bonding wire by sputtering or the like. Other effective methods include a method which uses acid washing.

EXAMPLES (Method for Producing Bonding Wire)

A method for producing a bonding wire will be described. The Cu used as a raw material had a purity of 99.99 mass % or more, and the balance being incidental impurities. When the bonding wire contained Ni, Pd, Pt, Au, P, In, Ga, Ge, and Ag as additive elements, Cu and these elements were melted in a high-frequency melting furnace and alloyed together. When a target total concentration of the additive elements except the incidental impurities was less than 0.5 mass %, an alloy of the intended concentration was prepared using a Cu alloy containing high concentrations of the additive elements.

An Ar atmosphere was used during melting to prevent admixture of impurities such as oxygen. The ingot produced by melting had a columnar shape with a diameter of a few mm. The surface of the resulting ingot was acid-washed using sulfuric acid, hydrochloric acid, or the like to remove an oxide film from the ingot. Subsequently, the ingot was subjected to a rolling process and forging process to produce a wire with a diameter in a range of 0.3 to 0.5 mm. Subsequently, intermediate heat treatment was carried out, and then, the wire was further processed by a drawing process to a diameter of 20 μm. The wire feed rate during the drawing process was 350 to 1100 m/min. A commercially available lubricant was used. In doing so, the processing rate per die was 14% or more and 24% or less. The intermediate heat treatment was carried out as many times as the processing rate of the drawing process in one thermomechanical treatment process was 85% or more and 99.5% or less. The intermediate heat treatment temperature was 300° C. or more and 620° C. or less. The intermediate heat treatment and final heat treatment were carried out at a temperature of 300 to 620° C., while continuously running the wire at a feed rate of 20 to 200 m/min. The heat treatment was carried out in a $N_2$ or Ar atmosphere to prevent oxidation. The configuration of the produced bonding wire is shown in Tables 1A and 1B.

TABLE 1A

| | | Direction perpendicular to one plane including wire center axis | Direction of wire center axis | | | Additive element | | | | | | | | | | |
|---|---|---|---|---|---|---|---|---|---|---|---|---|---|---|---|---|
| No. | Wire diameter μm | Abundance ratio (%) of crystal orientation <110> | Abundance ratio (%) of crystal orientation <111> | Abundance ratio (%) of crystal orientation <100> | Total | Ni | Pd | Pt | Au | Total | P | In | Ga | Ge | Ag | Total |
| Examples 1 | 20 | 30 | 12 | 22 | 34 | — | — | — | — | 0 | — | — | — | — | — | 0 |
| 2 | 20 | 70 | 11 | 20 | 31 | — | — | — | — | 0 | — | — | — | — | — | 0 |
| 3 | 20 | 35 | 21 | 16 | 37 | — | — | — | — | 0 | — | — | — | — | — | 0 |
| 4 | 20 | 65 | 22 | 13 | 35 | — | — | — | — | 0 | — | — | — | — | — | 0 |
| 5 | 20 | 46 | 21 | 29 | 50 | — | — | — | — | 0 | — | — | — | — | — | 0 |
| 6 | 20 | 42 | 30 | 60 | 90 | — | — | — | — | 0 | — | — | — | — | — | 0 |
| 7 | 20 | 56 | 32 | 45 | 77 | 0.01 | — | — | — | 0.01 | — | — | — | — | — | 0 |
| 8 | 20 | 49 | 35 | 42 | 77 | — | 0.01 | — | — | 0.01 | — | — | — | — | — | 0 |
| 9 | 20 | 55 | 44 | 40 | 84 | — | — | 0.01 | — | 0.01 | — | — | — | — | — | 0 |
| 10 | 20 | 48 | 36 | 44 | 80 | — | — | — | 0.01 | 0.01 | — | — | — | — | — | 0 |
| 11 | 20 | 39 | 29 | 48 | 77 | — | 0.26 | — | — | 0.26 | — | — | — | — | — | 0 |
| 12 | 20 | 46 | 39 | 44 | 83 | — | — | 0.5 | — | 0.50 | — | — | — | — | — | 0 |
| 13 | 20 | 55 | 20 | 67 | 87 | — | — | — | 3.00 | 3.00 | — | — | — | — | — | 0 |
| 14 | 20 | 60 | 33 | 45 | 78 | — | 3.00 | — | — | 3.00 | — | — | — | — | — | 0 |
| 15 | 20 | 59 | 61 | 19 | 80 | 3.00 | — | — | — | 3.00 | — | — | — | — | — | 0 |
| 16 | 20 | 54 | 26 | 51 | 77 | — | — | 3.00 | — | 3.00 | — | — | — | — | — | 0 |
| 17 | 20 | 41 | 29 | 42 | 71 | — | 0.004 | 0.006 | — | 0.01 | — | — | — | — | — | 0 |
| 18 | 20 | 49 | 36 | 49 | 85 | — | 0.004 | 0.006 | — | 0.01 | — | — | — | — | — | 0 |
| 19 | 20 | 51 | 59 | 22 | 81 | — | — | 2.8 | — | 2.80 | — | — | — | — | — | 0 |
| 20 | 20 | 61 | 61 | 19 | 80 | — | — | 0.75 | 0.010 | 0.76 | — | — | — | — | — | 0 |
| 21 | 20 | 48 | 39 | 39 | 78 | — | 0.24 | — | — | 0.24 | 0.0010 | — | — | — | — | 0.001 |
| 22 | 20 | 49 | 31 | 52 | 83 | — | 0.2 | — | — | 0.20 | — | 0.0010 | — | — | — | 0.001 |
| 23 | 20 | 50 | 65 | 19 | 84 | — | 0.25 | — | — | 0.25 | — | — | 0.0010 | — | — | 0.001 |
| 24 | 20 | 47 | 42 | 45 | 87 | — | 0.3 | — | — | 0.30 | — | — | — | 0.0010 | — | 0.001 |
| 25 | 20 | 48 | 42 | 44 | 86 | — | 0.25 | — | — | 0.25 | — | — | — | — | 0.0010 | 0.001 |
| 26 | 20 | 39 | 28 | 45 | 73 | — | 0.26 | — | — | 0.26 | 1.0000 | — | — | — | — | 1.000 |
| 27 | 20 | 62 | 45 | 29 | 74 | — | 0.22 | — | — | 0.22 | — | 1.0000 | — | — | — | 1.000 |
| 28 | 20 | 44 | 40 | 39 | 79 | — | 0.25 | — | — | 0.25 | — | — | 1.0000 | — | — | 1.000 |
| 29 | 20 | 41 | 40 | 40 | 80 | — | 0.24 | — | — | 0.24 | — | — | — | 1.0000 | — | 1.000 |
| 30 | 20 | 42 | 41 | 41 | 82 | — | 0.24 | — | — | 0.24 | — | — | — | — | 1 | 1.000 |
| 31 | 20 | 41 | 37 | 29 | 66 | — | 0.21 | — | — | 0.21 | 0.0005 | — | — | — | 0.0005 | 0.001 |
| 32 | 20 | 49 | 35 | 45 | 80 | — | 0.22 | — | — | 0.22 | — | 0.0005 | — | — | 0.0005 | 0.001 |
| 33 | 20 | 54 | 40 | 42 | 82 | — | 0.25 | — | — | 0.25 | — | — | 0.0005 | — | 0.0005 | 0.001 |

TABLE 1A-continued

| | | Direction perpendicular to one plane including wire center axis | Direction of wire center axis | | | Additive element | | | | | | | | | | |
|---|---|---|---|---|---|---|---|---|---|---|---|---|---|---|---|---|
| No. | Wire diameter μm | Abundance ratio (%) of crystal orientation <110> | Abundance ratio (%) of crystal orientation <111> | Abundance ratio (%) of crystal orientation <100> | Total | Ni | Pd | Pt | Au | Total | P | In | Ga | Ge | Ag | Total |
| 34 | 20 | 44 | 40 | 45 | 85 | — | 0.24 | — | — | 0.24 | — | — | — | 0.0005 | 0.0005 | 0.001 |
| 35 | 20 | 40 | 38 | 29 | 67 | — | 0.22 | — | — | 0.22 | 0.5000 | — | — | — | 0.5 | 1.000 |
| 36 | 20 | 47 | 33 | 45 | 78 | — | 0.22 | — | — | 0.22 | — | 0.5000 | — | — | 0.5 | 1.000 |
| 37 | 20 | 53 | 40 | 42 | 82 | — | 0.23 | — | — | 0.23 | — | — | 0.5000 | — | 0.5 | 1.000 |
| 38 | 20 | 40 | 41 | 45 | 86 | — | 0.23 | — | — | 0.23 | — | — | — | 0.5000 | 0.5 | 1.000 |
| 39 | 20 | 44 | 40 | 40 | 80 | — | — | 0.3 | — | 0.30 | 0.0010 | — | — | — | — | 0.001 |
| 40 | 20 | 45 | 46 | 33 | 79 | — | — | 0.29 | — | 0.29 | — | 0.0010 | — | — | — | 0.001 |
| 41 | 20 | 41 | 34 | 36 | 70 | — | — | 0.28 | — | 0.28 | — | — | 0.0010 | — | — | 0.001 |
| 42 | 20 | 38 | 31 | 49 | 80 | — | — | 0.22 | — | 0.22 | — | — | — | 0.0010 | — | 0.001 |
| 43 | 20 | 42 | 30 | 42 | 72 | — | — | 0.27 | — | 0.27 | — | — | — | — | 0.001 | 0.001 |
| 44 | 20 | 49 | 41 | 45 | 86 | — | — | 0.29 | — | 0.29 | 1.0000 | — | — | — | — | 1.000 |
| 45 | 20 | 46 | 40 | 33 | 73 | — | — | 0.24 | — | 0.24 | — | 1.0000 | — | — | — | 1.000 |
| 46 | 20 | 44 | 36 | 39 | 75 | — | — | 0.26 | — | 0.26 | — | — | 1.0000 | — | — | 1.000 |
| 47 | 20 | 38 | 40 | 42 | 82 | — | — | 0.3 | — | 0.30 | — | — | — | 1.0000 | — | 1.000 |
| 48 | 20 | 44 | 40 | 41 | 81 | — | — | 0.26 | — | 0.26 | — | — | — | — | 1.0000 | 1.000 |

TABLE 1B

| | | Direction perpendicular to one plane including wire center axis | Direction of wire center axis | | | Additive element | | | | | | | | | | |
|---|---|---|---|---|---|---|---|---|---|---|---|---|---|---|---|---|
| | Wire diameter | Abundance ratio (%) of crystal orientation | Abundance ratio (%) of crystal orientation | Abundance ratio (%) of crystal orientation | | | | | | | | | | | | |
| No. | μm | <110> | <111> | <100> | Total | Ni | Pd | Pt | Au | Total | P | In | Ga | Ge | Ag | Total |
| Examples | | | | | | | | | | | | | | | | |
| 49 | 20 | 60 | 44 | 42 | 86 | — | — | 0.26 | — | 0.26 | 0.0005 | — | — | — | 0.0005 | 0.001 |
| 50 | 20 | 55 | 19 | 64 | 83 | — | — | 0.27 | — | 0.27 | — | 0.0005 | — | — | 0.0005 | 0.001 |
| 51 | 20 | 53 | 21 | 46 | 67 | — | — | 0.29 | — | 0.29 | — | — | 0.0005 | — | 0.0005 | 0.001 |
| 52 | 20 | 50 | 33 | 41 | 74 | — | — | 0.28 | — | 0.28 | — | — | — | 0.0005 | 0.0005 | 0.001 |
| 53 | 20 | 45 | 34 | 45 | 79 | — | — | — | — | 0 | 0.0010 | — | — | — | — | 0.001 |
| 54 | 20 | 50 | 39 | 45 | 84 | — | — | — | — | 0 | — | 0.0010 | — | — | — | 0.001 |
| 55 | 20 | 56 | 45 | 37 | 82 | — | — | — | — | 0 | — | — | 0.0010 | — | — | 0.001 |
| 56 | 20 | 61 | 40 | 39 | 79 | — | — | — | — | 0 | — | — | — | 0.0010 | — | 0.001 |
| 57 | 20 | 48 | 40 | 40 | 80 | — | — | — | — | 0 | — | — | — | — | 0.001 | 0.001 |
| 58 | 20 | 44 | 41 | 44 | 85 | — | — | — | — | 0 | 1.0000 | — | — | — | — | 1.000 |
| 59 | 20 | 49 | 39 | 34 | 73 | — | — | — | — | 0 | — | 1.0000 | — | — | — | 1.000 |
| 60 | 20 | 42 | 43 | 39 | 82 | — | — | — | — | 0 | — | — | 1.0000 | — | — | 1.000 |
| 61 | 20 | 41 | 40 | 40 | 80 | — | — | — | — | 0 | — | — | — | 1.0000 | — | 1.000 |
| 62 | 20 | 44 | 40 | 41 | 81 | — | — | — | — | 0 | — | — | — | — | 1.0000 | 1.000 |
| 63 | 20 | 37 | 39 | 45 | 84 | — | — | — | — | 0 | 0.0005 | — | — | — | 0.0005 | 0.001 |
| 64 | 20 | 46 | 36 | 45 | 81 | — | — | — | — | 0 | — | 0.0005 | — | — | 0.0005 | 0.001 |
| 65 | 20 | 49 | 40 | 44 | 84 | — | — | — | — | 0 | — | — | 0.0005 | — | 0.0005 | 0.001 |
| 66 | 20 | 45 | 40 | 45 | 85 | — | — | — | — | 0 | — | — | — | 0.0005 | 0.0005 | 0.001 |
| 67 | 20 | 44 | 38 | 42 | 80 | — | — | — | — | 0 | — | — | — | — | 0.01 | 0.010 |
| 68 | 20 | 45 | 39 | 43 | 82 | — | — | — | — | 0 | — | — | — | — | 0.03 | 0.030 |
| 69 | 20 | 42 | 40 | 41 | 81 | — | — | — | — | 0 | — | — | — | — | 0.04 | 0.040 |
| 70 | 20 | 41 | 41 | 40 | 81 | — | — | — | — | 0 | — | — | — | — | 0.05 | 0.050 |
| 71 | 20 | 42 | 43 | 41 | 84 | — | — | — | — | 0 | — | — | — | — | 0.06 | 0.060 |
| 72 | 20 | 43 | 44 | 42 | 86 | — | — | — | — | 0 | — | — | — | — | 0.07 | 0.070 |
| 73 | 20 | 40 | 45 | 40 | 85 | — | — | — | — | 0 | — | — | — | — | 0.08 | 0.080 |
| 74 | 20 | 41 | 41 | 40 | 81 | — | — | — | — | 0 | — | — | — | — | 0.09 | 0.090 |
| 75 | 20 | 43 | 37 | 41 | 78 | — | — | — | — | 0 | — | 0.0100 | — | — | 0.01 | 0.020 |
| 76 | 20 | 42 | 38 | 40 | 78 | — | — | — | — | 0 | — | 0.0200 | — | — | 0.03 | 0.050 |
| 77 | 20 | 42 | 40 | 40 | 80 | — | — | — | — | 0 | — | 0.0300 | — | — | 0.04 | 0.070 |
| 78 | 20 | 41 | 44 | 39 | 83 | — | — | — | — | 0 | — | 0.0200 | — | — | 0.05 | 0.070 |
| 79 | 20 | 43 | 42 | 40 | 82 | — | — | — | — | 0 | — | 0.0300 | — | — | 0.06 | 0.090 |
| 80 | 20 | 44 | 43 | 40 | 83 | — | — | — | — | 0 | — | 0.0100 | — | — | 0.07 | 0.080 |

TABLE 1B-continued

| | | Wire diameter | Direction perpendicular to one plane including wire center axis | Direction of wire center axis | | | Additive element | | | | | | | | | |
|---|---|---|---|---|---|---|---|---|---|---|---|---|---|---|---|---|---|
| | | | Abundance ratio (%) of crystal orientation | Abundance ratio (%) of crystal orientation | Abundance ratio (%) of crystal orientation | | | | | | | | | | | | |
| No. | | μm | <110> | <111> | <100> | Total | Ni | Pd | Pt | Au | Total | P | In | Ga | Ge | Ag | Total |
| 81 | | 20 | 42 | 42 | 41 | 83 | — | — | — | — | 0 | — | 0.0200 | — | — | 0.08 | 0.100 |
| 82 | | 20 | 41 | 40 | 42 | 82 | — | — | — | — | 0 | — | 0.0200 | — | — | 0.09 | 0.110 |
| 83 | | 20 | 42 | 38 | 41 | 79 | — | — | — | — | 0 | — | — | 0.0200 | — | 0.01 | 0.030 |
| 84 | | 20 | 43 | 39 | 44 | 83 | — | — | — | — | 0 | — | — | 0.0200 | — | 0.03 | 0.050 |
| 85 | | 20 | 42 | 43 | 41 | 84 | — | — | — | — | 0 | — | — | 0.0100 | — | 0.04 | 0.050 |
| 86 | | 20 | 43 | 42 | 40 | 82 | — | — | — | — | 0 | — | — | 0.0200 | — | 0.05 | 0.070 |
| 87 | | 20 | 42 | 42 | 42 | 84 | — | — | — | — | 0 | — | — | 0.0100 | — | 0.06 | 0.070 |
| 88 | | 20 | 42 | 43 | 41 | 84 | — | — | — | — | 0 | — | — | 0.0300 | — | 0.07 | 0.100 |
| 89 | | 20 | 40 | 44 | 39 | 83 | — | — | — | — | 0 | — | — | 0.0100 | — | 0.08 | 0.090 |
| 90 | | 20 | 41 | 40 | 40 | 80 | — | — | — | — | 0 | — | — | 0.0100 | — | 0.09 | 0.100 |
| 91 | | 20 | 29 | 26 | 20 | 46 | — | — | — | — | 0 | — | — | — | — | — | 0.000 |
| 92 | | 20 | 25 | 43 | 41 | 84 | — | — | — | — | 0 | — | — | — | — | — | 0.000 |
| 93 | | 20 | 65 | 55 | 43 | 98 | — | — | — | — | 0 | — | — | — | — | — | 0.000 |
| 94 | | 20 | 60 | 50 | 49 | 99 | — | — | — | — | 0 | — | — | — | — | — | 0.000 |
| Comparative Examples | 1 | 20 | 24 | 42 | 41 | 83 | — | — | — | — | 0 | — | — | — | — | — | 0.000 |
| | 2 | 20 | 71 | 24 | 20 | 44 | — | — | — | — | 0 | — | — | — | — | — | 0.000 |

(Evaluation Method)

The concentrations of the additive elements contained in the bonding wire of the present embodiment were analyzed using an ICP optical emission spectrometer. The wire diameter of the bonding wire used for the present evaluation was 20 μm.

The abundance ratio of the crystal orientation <110> having an angular difference of 15 degrees or less from the direction perpendicular to one plane including the wire center axis to the crystal orientations on the wire surface of the bonding wire of the present embodiment was calculated from data measured by the EBSD method. The abundance ratio was the average value of measured values taken at 10 locations of the wire at intervals of 3 m. The measurement region was a region surrounded by a straight line with a length of 5 μm (25% the wire diameter) in the circumferential direction and a straight line with a length of 40 μm in the direction of the wire center axis on a screen on which EBSD measurements were taken. Furthermore, the measurement region included the highest point of the wire sample fixed to the sample stage, regarding the circumferential direction.

The abundance ratios of crystal orientations <111> and <100> having an angular difference of 15 degrees or less from the direction of the wire center axis to the crystal orientations on the wire surface of the bonding wire of the present embodiment were calculated from data measured by the EBSD method. The abundance ratios were the arithmetic averages of values taken at 10 locations of the wire at intervals of 3 m. The measurement region was a region surrounded by a straight line with a length of 5 μm (25% the wire diameter) in the circumferential direction and a straight line with a length of 40 μm in the direction of the wire center axis on a screen on which EBSD measurements were taken. Furthermore, the measurement region included the highest point of the wire sample fixed to the sample stage, regarding the circumferential direction.

(Evaluation Method for Occurrence Rate of Peelings)

Using a commercially available bonding machine, 100 the bonding wires were bonded to a metal lead frame having a Pd-PPF. Subsequently, wedge bond areas were observed under an optical microscope to check all the 100 wedge bond areas for peelings. The occurrence rate of peelings was the ratio of wedge bond areas subjected to peelings to the 100 wedge bond areas. In the above evaluation, when the occurrence rate of peelings was 7% or more, 0 points were given by judging that there was a problem in practical use; when the occurrence rate of peelings was 5% or more and less than 7%, 1 point was given by judging that the bonding wire was practicable; when the occurrence rate of peelings was 1% or more and less than 5%, 2 points were given by judging that there was no problem in practical use; and when there was no peeling, 3 points were given by judging that the result was excellent. Evaluation results are shown in the "Occurrence rate of peelings" fields of Tables 2A and 2B. Only the 0 points were rejected, and the other points were accepted.

(Evaluation Method for Occurrence Rate of Eccentricity)

The occurrence rate of eccentricity was evaluated by forming 100 balls using a commercially available bonding machine and observing the balls under an SEM. The target value of ball diameter was 28 μm, which was 1.4 times the wire diameter. By judging that variation in ball diameter would not affect evaluation results if the ball diameter fell within 28±1 μm, the balls within this range were used for evaluation. The balls were formed with blowing $N_2$+5 vol. % $H_2$ gas. The flow rate was 0.5±0.1 L/min. When the occurrence rate of eccentricity was 5% or more, 0 points were given by judging that there was a problem in practical use; and when the occurrence rate of eccentricity was less than 5%, 1 point was given by judging that there was no problem in practical use. Evaluation results are shown in the "Occurrence rate of eccentricity" fields of Tables 2A and 2B. The 0 points were rejected, and 1 point was accepted.

(Evaluation Method for Low Temperature Bonding Performance)

To evaluate low temperature bonding performance, 2000 wires were bonded at a bonding temperature of 160° C. and the performance was judged based on the number of times the bonding machine stopped due to a non-stick failure. The bonding wire was bonded to a Ag-plated metal lead frame. In the above evaluation, when the bonding machine stopped 5 times or more, 0 points were given by judging that there was a problem in practical use; when the bonding machine stopped once or more and less than 5 times, 1 point was given by judging that there was no problem in practical use; and when the bonding machine never stopped, 2 points were given by judging that the result was excellent. Evaluation results are shown in the "Low temperature bonding performance" fields of Tables 2A and 2B. Only the 0 points were rejected, and the other points were accepted.

(Evaluation Method for Ball Bond Area Life in High Temperature Storage Test)

Samples for high temperature storage test were manufactured as follows: electrodes were prepared by forming an Al film having a thickness of 1.0 μm on a Si substrate on a typical metal frame, ball-bonded using a commercially available wire bonder, and sealed by a commercially available epoxy resin. The balls were formed with running $N_2$ and 5 vol. % $H_2$ gas at a flow rate of 0.4 to 0.6 L/min and the ball diameter was in a range of 1.5 to 1.6 times the wire diameter. A thermostatic oven in which $N_2$ gas was refluxed was used for the high temperature storage test. The test temperature was 200° C. The time required for the bonding strength of the ball bond areas to fall to 50% or less of the bonding strength before the start of test was used as the life of ball bond areas in the high temperature storage test. In the present evaluation, the bonding strength of the ball bond areas was measured every 100 hours. Values measured by a micro area bond tester made by DAGE Co., Ltd. was used as the bonding strength of the ball bond areas. After the high temperature storage test, the ball bond areas were exposed by removing resin by acid treatment, and then a shear test was conducted. The average value of measured values of ten ball bond areas selected at random was used as the value of shear strength. In the above evaluation, when the life of the ball bond area was less than 500 hours, 0 points were given by judging that there was a problem in practical use; when the life of the ball bond area was 500 hours or more and less than 700 hours, 1 point was given by judging that there was no problem in practical use; when the life of the ball bond area was 700 hours or more, 2 point were given by judging that the result was excellent; and when the life of the ball bond area was 1000 hours or more, 3 points were given by judging that the result was particularly excellent. Evaluation results are shown in the "Ball bond area life in high temperature storage test" fields of Tables 2A and 2B. Only the 0 points were rejected, and the other points were accepted.

(Evaluation Method for Crimping Ball Shape)

The crimping ball shape was evaluated as follows: electrodes were prepared by forming an Al film having a thickness of 1.2 μm on a Si substrate, ball-bonded using a commercially available wire bonder, and observed from directly above using an optical microscope. Crimping ball shapes were judged as follows: a crimping shape close to a circular shape was judged to be good and a crimping shape being oval or petaline was judged to be defective. One hundred ball bond areas were observed under an optical microscope, and when there were 9 or more defective bonds, 0 points were given by judging that there was a problem in practical use; when there were 6 or more and 8 or less defective bonds, 1 point was given by judging that there was no problem in practical use; when there were 3 or more and 5 or less defective bonds, 2 points were given by judging that the result was good; when there were 1 or 2 defective bonds, 3 points were given by judging that the result was excellent; and when there was no defective bond, 4 points were given by judging that the result was particularly excellent. Evaluation results are shown in the "Crimping ball shape" fields of Tables 2A and 2B. Only the 0 points were rejected, and the other points were accepted.

(Description of Evaluation Results)

Examples No. 1 to 94 were alloy bonding wires for a semiconductor device, where the abundance ratio of the crystal orientation <110> having an angular difference of 15 degrees or less from the direction perpendicular to one plane including the wire center axis to the crystal orientations on the wire surface was 25% or more and 70% or less in average area percentage. Thus, all the alloy bonding wires were practicable both in terms of occurrence rate of peelings and occurrence rate of eccentricity. Examples No. 1 to 90, 93, and 94, in which the abundance ratio of the crystal orientation <110> were 30% or more and 70% or less in average area percentage, had no problem in practical use both in terms of occurrence rate of peelings and occurrence rate of eccentricity.

Examples No. 2, 4 to 10, 12 to 25, 27 to 41, 43 to 46, 48 to 62, 64 to 90, 93, and 94 were Cu alloy bonding wires for a semiconductor device, where the abundance ratio of the crystal orientation <110> having an angular difference of 15 degrees or less from the direction perpendicular to one plane including the wire center axis to the crystal orientations on the wire surface was 40% or more and 70% or less in average area percentage. Thus, excellent evaluation results were obtained in every case in terms of occurrence rate of peelings.

Examples No. 5 to 90, 92, 93, in which, the total of the abundance ratios of the crystal orientations <111> and <100> having an angular difference of 15 degrees or less from the direction of the wire center axis to the crystal orientations on the wire surface was 50% or more and 98% or less in average area percentage, produced excellent evaluation results in terms of low temperature bonding performance.

Examples No. 7 to 20, which contained one or more of Ni, Pd, Pt, and Au for a total of 0.01 mass % or more and 3.00 mass % or less, produced excellent evaluation results in terms of ball bond area life in high temperature storage test. Examples No. 9, 12, 15, and 17 to 20, which contained Pt, produced a particularly excellent improvement effect on ball bond area life in 200° C. high temperature storage test.

Examples No. 53 to 90, which contained one or more of P, In, Ga, Ge, and Ag for a total of 0.001 mass % or more and 1.00 mass % or less, produced good evaluation results in terms of crimping ball shape. Examples No. 53 to 57, 63 to 81, and 83 to 90, which contained one or more of P, In, Ga, Ge, and Ag for a total of 0.001 mass % or more and 0.1 mass % or less, produced excellent evaluation results in terms of crimping ball shape. Examples No. 57, 63 to 81, and 83 to 90, which contained Ag, produced particularly excellent evaluation results in terms of crimping ball shape.

Examples No. 21 to 52, which contained one or more of Ni, Pd, Pt, and Au for a total of 0.01 mass % or more and 3.00 mass % or less and further contained one or more of P, In, Ga, Ge, and Ag for a total of 0.001 mass % or more and 1.00 mass % or less, produced excellent evaluation results in terms of ball bond area life in high temperature storage test as well as produced good evaluation results in terms of crimping ball shape. Examples No. 39 to 52, which contained Pt, produced a particularly excellent improvement effect on ball bond area life in 200° C. high temperature storage test. Examples No. 21 to 25, 31 to 34, 39 to 43, and 49 to 52, which contained one or more of P, In, Ga, Ge, and Ag for a total of 0.001 mass % or more and 0.1 mass % or less, produced excellent evaluation results in terms of crimping ball shape. Examples No. 25, 31 to 34, 43, and 49 to 52, which contained Ag, produced particularly excellent evaluation results in terms of crimping ball shape.

TABLE 2A

| | | Evaluation results | | | | |
|---|---|---|---|---|---|---|
| | No. | Occurrence rate of peelings (7% or more: 0 pts; 5% or more and less than 7%: 1 pt; 1% or more and less than 5%: 2 pts; 0%: 3 pts) | Occurrence rate of eccentricity (5% or more: 0 pts; 1% or more and less than 5%: 1 pt) | Low temperature bonding performance (5 times or more: 0 pts; once or more and less than 5 times: 1 pt; 0 times: 2 pts) | Ball bond area life in high temperature storage test (less than 500 hours: 0 pts; 500 hours or more and less than 700 hours: 1 pt; 700 hours or more: 2 pts; 1000 hours or more: 3 pts) | Crimping ball shape (9 or more defects: 0 pts; 6 or more and 8 or less defects: 1 pt; 3 or more and 5 or less defects: 2 pts; 1 or 2 defects: 3 pts; 0 defects: 4 pts) |
| Examples | 1 | 2 | 1 | 1 | 1 | 1 |
| | 2 | 3 | 1 | 1 | 1 | 1 |
| | 3 | 2 | 1 | 1 | 1 | 1 |
| | 4 | 3 | 1 | 1 | 1 | 1 |
| | 5 | 3 | 1 | 2 | 1 | 1 |
| | 6 | 3 | 1 | 2 | 1 | 1 |
| | 7 | 3 | 1 | 2 | 2 | 1 |
| | 8 | 3 | 1 | 2 | 2 | 1 |
| | 9 | 3 | 1 | 2 | 3 | 1 |
| | 10 | 3 | 1 | 2 | 2 | 1 |
| | 11 | 2 | 1 | 2 | 2 | 1 |
| | 12 | 3 | 1 | 2 | 3 | 1 |
| | 13 | 3 | 1 | 2 | 2 | 1 |
| | 14 | 3 | 1 | 2 | 2 | 1 |
| | 15 | 3 | 1 | 2 | 3 | 1 |
| | 16 | 3 | 1 | 2 | 2 | 1 |

TABLE 2A-continued

| | No. | Occurrence rate of peelings (7% or more: 0 pts; 5% or more and less than 7%: 1 pt; 1% or more and less than 5%: 2 pts; 0%: 3 pts) | Occurrence rate of eccentricity (5% or more: 0 pts; 1% or more and less than 5%: 1 pt) | Low temperature bonding performance (5 times or more: 0 pts; once or more and less than 5 times: 1 pt; 0 times: 2 pts) | Ball bond area life in high temperature storage test (less than 500 hours: 0 pts; 500 hours or more and less than 700 hours: 1 pt; 700 hours or more: 2 pts; 1000 hours or more: 3 pts) | Crimping ball shape (9 or more defects: 0 pts; 6 or more and 8 or less defects: 1 pt; 3 or more and 5 or less defects: 2 pts; 1 or 2 defects: 3 pts; 0 defects: 4 pts) |
|---|---|---|---|---|---|---|
| | 17 | 3 | 1 | 2 | 3 | 1 |
| | 18 | 3 | 1 | 2 | 3 | 1 |
| | 19 | 3 | 1 | 2 | 3 | 1 |
| | 20 | 3 | 1 | 2 | 3 | 1 |
| | 21 | 3 | 1 | 2 | 2 | 3 |
| | 22 | 3 | 1 | 2 | 2 | 3 |
| | 23 | 3 | 1 | 2 | 2 | 3 |
| | 24 | 3 | 1 | 2 | 2 | 3 |
| | 25 | 3 | 1 | 2 | 2 | 4 |
| | 26 | 2 | 1 | 2 | 2 | 2 |
| | 27 | 3 | 1 | 2 | 2 | 2 |
| | 28 | 3 | 1 | 2 | 2 | 2 |
| | 29 | 3 | 1 | 2 | 2 | 2 |
| | 30 | 3 | 1 | 2 | 2 | 2 |
| | 31 | 3 | 1 | 2 | 2 | 4 |
| | 32 | 3 | 1 | 2 | 2 | 4 |
| | 33 | 3 | 1 | 2 | 2 | 4 |
| | 34 | 3 | 1 | 2 | 2 | 4 |
| | 35 | 3 | 1 | 2 | 2 | 2 |
| | 36 | 3 | 1 | 2 | 2 | 2 |
| | 37 | 3 | 1 | 2 | 2 | 2 |
| | 38 | 3 | 1 | 2 | 2 | 2 |
| | 39 | 3 | 1 | 2 | 3 | 3 |
| | 40 | 3 | 1 | 2 | 3 | 3 |
| | 41 | 3 | 1 | 2 | 3 | 3 |
| | 42 | 2 | 1 | 2 | 3 | 3 |
| | 43 | 3 | 1 | 2 | 3 | 4 |
| | 44 | 3 | 1 | 2 | 3 | 2 |
| | 45 | 3 | 1 | 2 | 3 | 2 |
| | 46 | 3 | 1 | 2 | 3 | 2 |
| | 47 | 2 | 1 | 2 | 3 | 2 |
| | 48 | 3 | 1 | 2 | 3 | 2 |

TABLE 2B

| | No. | Occurrence rate of peelings (7% or more: 0 pts; 5% or more and less than 7%: 1 pt; 1% or more and less than 5%: 2 pts; 0%: 3 pts) | Occurrence rate of eccentricity (5% or more: 0 pts; 1% or more and less than 5%: 1 pt) | Low temperature bonding performance (5 times or more: 0 pts; once or more and less than 5 times: 1 pt; 0 times: 2 pts) | Ball bond area life in high temperature storage test (less than 500 hours: 0 pts; 500 hours or more and less than 700 hours: 1 pt; 700 hours or more: 2 pts; 1000 hours or more: 3 pts) | Crimping ball shape (9 or more defects: 0 pts; 6 or more and 8 or less defects: 1 pt; 3 or more and 5 or less defects: 2 pts; 1 or 2 defects: 3 pts; 0 defects: 4) |
|---|---|---|---|---|---|---|
| Examples | 49 | 3 | 1 | 2 | 3 | 4 |
| | 50 | 3 | 1 | 2 | 3 | 4 |
| | 51 | 3 | 1 | 2 | 3 | 4 |
| | 52 | 3 | 1 | 2 | 3 | 4 |
| | 53 | 3 | 1 | 2 | 1 | 3 |
| | 54 | 3 | 1 | 2 | 1 | 3 |
| | 55 | 3 | 1 | 2 | 1 | 3 |
| | 56 | 3 | 1 | 2 | 1 | 3 |
| | 57 | 3 | 1 | 2 | 1 | 4 |
| | 58 | 3 | 1 | 2 | 1 | 2 |
| | 59 | 3 | 1 | 2 | 1 | 2 |
| | 60 | 3 | 1 | 2 | 1 | 2 |
| | 61 | 3 | 1 | 2 | 1 | 2 |
| | 62 | 3 | 1 | 2 | 1 | 2 |
| | 63 | 2 | 1 | 2 | 1 | 4 |
| | 64 | 3 | 1 | 2 | 1 | 4 |
| | 65 | 3 | 1 | 2 | 1 | 4 |
| | 66 | 3 | 1 | 2 | 1 | 4 |
| | 67 | 3 | 1 | 2 | 1 | 4 |
| | 68 | 3 | 1 | 2 | 1 | 4 |

TABLE 2B-continued

Evaluation results

| No. | Occurrence rate of peelings (7% or more: 0 pts; 5% or more and less than 7%: 1 pt; 1% or more and less than 5%: 2 pts; 0%: 3 pts) | Occurrence rate of eccentricity (5% or more: 0 pts; 1% or more and less than 5%: 1 pt) | Low temperature bonding performance (5 times or more: 0 pts; once or more and less than 5 times: 1 pt; 0 times: 2 pts) | Ball bond area life in high temperature storage test (less than 500 hours: 0 pts; 500 hours or more and less than 700 hours: 1 pt; 700 hours or more: 2 pts; 1000 hours or more: 3 pts) | Crimping ball shape (9 or more defects: 0 pts; 6 or more and 8 or less defects: 1 pt; 3 or more and 5 or less defects: 2 pts; 1 or 2 defects: 3 pts; 0 defects: 4) |
|---|---|---|---|---|---|
| 69 | 3 | 1 | 2 | 1 | 4 |
| 70 | 3 | 1 | 2 | 1 | 4 |
| 71 | 3 | 1 | 2 | 1 | 4 |
| 72 | 3 | 1 | 2 | 1 | 4 |
| 73 | 3 | 1 | 2 | 1 | 4 |
| 74 | 3 | 1 | 2 | 1 | 4 |
| 75 | 3 | 1 | 2 | 1 | 4 |
| 76 | 3 | 1 | 2 | 1 | 4 |
| 77 | 3 | 1 | 2 | 1 | 4 |
| 78 | 3 | 1 | 2 | 1 | 4 |
| 79 | 3 | 1 | 2 | 1 | 4 |
| 80 | 3 | 1 | 2 | 1 | 4 |
| 81 | 3 | 1 | 2 | 1 | 4 |
| 82 | 3 | 1 | 2 | 1 | 2 |
| 83 | 3 | 1 | 2 | 1 | 4 |
| 84 | 3 | 1 | 2 | 1 | 4 |
| 85 | 3 | 1 | 2 | 1 | 4 |
| 86 | 3 | 1 | 2 | 1 | 4 |
| 87 | 3 | 1 | 2 | 1 | 4 |
| 88 | 3 | 1 | 2 | 1 | 4 |
| 89 | 3 | 1 | 2 | 1 | 4 |
| 90 | 3 | 1 | 2 | 1 | 4 |
| 91 | 1 | 1 | 1 | 1 | 1 |
| 92 | 1 | 1 | 2 | 1 | 1 |
| 93 | 3 | 1 | 2 | 1 | 1 |
| 94 | 3 | 1 | 1 | 1 | 1 |
| Comparative Examples 1 | 0 | 0 | 0 | 1 | 1 |
| 2 | 1 | 0 | 1 | 1 | 1 |

The invention claimed is:

1. A Cu alloy bonding wire for a semiconductor device, wherein an abundance ratio of a crystal orientation <110> having an angular difference of 15 degrees or less from a direction perpendicular to one plane including a wire center axis to crystal orientations on a wire surface is 25% or more and 70% or less in average area percentage.

2. The Cu alloy bonding wire for a semiconductor device according to claim 1, wherein a total of abundance ratios of crystal orientations <111> and <100> having an angular difference of 15 degrees or less from the direction of the wire center axis to the crystal orientations on the wire surface is 50% or more and 98% or less in average area percentage.

3. The Cu alloy bonding wire for a semiconductor device according to claim 1, wherein the Cu alloy bonding wire contains one or more of Ni, Pd, Pt, and Au for a total of 0.01 mass % or more and 3.00 mass % or less and a balance being Cu and incidental impurities.

4. The Cu alloy bonding wire for a semiconductor device according to claim 1, wherein the Cu alloy bonding wire contains one or more of P, In, Ga, Ge, and Ag for a total of 0.001 mass % or more and 1.00 mass % or less and a balance being Cu and incidental impurities.

5. The Cu alloy bonding wire for a semiconductor device according to claim 3, wherein the Cu alloy bonding wire further contains one or more of P, In, Ga, Ge, and Ag for a total of 0.001 mass % or more and 1.00 mass % or less and a balance being Cu and incidental impurities.

6. The Cu alloy bonding wire for a semiconductor device according to claim 2, wherein the Cu alloy bonding wire contains one or more of Ni, Pd, Pt, and Au for a total of 0.01 mass % or more and 3.00 mass % or less and a balance being Cu and incidental impurities.

7. The Cu alloy bonding wire for a semiconductor device according to claim 2, wherein the Cu alloy bonding wire contains one or more of P, In, Ga, Ge, and Ag for a total of 0.001 mass % or more and 1.00 mass % or less and a balance being Cu and incidental impurities.

8. The Cu alloy bonding wire for a semiconductor device according to claim 6, wherein the Cu alloy bonding wire further contains one or more of P, In, Ga, Ge, and Ag for a total of 0.001 mass % or more and 1.00 mass % or less and a balance being Cu and incidental impurities.

* * * * *